(12) United States Patent
Cadee

(10) Patent No.: US 7,180,571 B2
(45) Date of Patent: Feb. 20, 2007

(54) LITHOGRAPHIC PROJECTION APPARATUS AND ACTUATOR

(75) Inventor: Theodorus Petrus Maria Cadee, Vlierden (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/006,821

(22) Filed: Dec. 8, 2004

(65) Prior Publication Data

US 2006/0119810 A1 Jun. 8, 2006

(51) Int. Cl.
*G03B 27/42* (2006.01)

(52) U.S. Cl. ............................ 355/30; 355/53; 355/72; 378/34; 378/35

(58) Field of Classification Search ...................... None
See application file for complete search history.

(56) References Cited

U.S. PATENT DOCUMENTS

| | | | |
|---|---|---|---|
| 6,731,371 B1* | 5/2004 | Shiraishi ...................... 355/30 |
| 2002/0018190 A1* | 2/2002 | Nogawa et al. ............... 355/30 |
| 2004/0212794 A1 | 10/2004 | Mizuno ........................ 355/72 |
| 2005/0243293 A1* | 11/2005 | Hara et al. .................... 355/53 |
| 2005/0280791 A1* | 12/2005 | Nagasaka et al. ............. 355/53 |
| 2006/0033901 A1* | 2/2006 | Hara ............................ 355/53 |

FOREIGN PATENT DOCUMENTS

| | | |
|---|---|---|
| EP | 1 477 856 A1 | 11/2004 |
| EP | 1 667 210 A1 | 6/2006 |
| JP | 2002-373849 | 12/2002 |
| WO | WO 2005/093791 A1 | 10/2005 |

OTHER PUBLICATIONS

European Search Report issued for European Patent Application No. 05077759.8-2222, dated Aug. 28, 2006.

* cited by examiner

*Primary Examiner*—D. Rutledge
(74) *Attorney, Agent, or Firm*—Pillsbury Winthrop Shaw Pittman LLP

(57) ABSTRACT

A lithographic projection apparatus is disclosed. The apparatus includes a substrate support constructed to support a substrate, a projection system configured to project a patterned radiation beam onto a target portion of the substrate, and a frame onto which at least a part of the projection system is mounted. A fluid provider is arranged to provide a fluid between the substrate and a downstream end of the projection system. The apparatus also includes an actuator associated with the frame and with the fluid provider and arranged to position the fluid provider, and a cushion system for cushioning vibrational forces when the actuator positions the fluid provider.

30 Claims, 8 Drawing Sheets

LITHOGRAPHIC PROJECTION APPARATUS AND ACTUATOR

FIELD

The present invention relates to a lithographic projection apparatus and an actuator.

BACKGROUND

A lithographic projection apparatus is a machine that applies a desired pattern onto a substrate, usually onto a target portion of the substrate. A lithographic projection apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Often particles, such as hydrocarbon particles or particles of radiation sensitive material, are present in the surroundings of the projection system or released from the substrate, respectively. Particles originating from the substrate may be released either when the substrate, in particular the radiation sensitive material, is exposed to the patterned beam, or when other processing of the substrate occurs, before or after exposure to the patterned beam. Particles, originating from the substrate or present in the surroundings of the projection system, may interact, for example, with an optically active surface, i.e. a surface through which the patterned beam passes and/or changes its direction. Such an optically active surface may also be present in a lithographic apparatus at positions that do not belong to the projection system, such as optically active surfaces that are located towards the end of the projection system, downstream with respect to the propagation direction of the patterned beam. Such an end, hereinafter also referred to as the "bottom" of the projection system, may include, for example, a lens surface or a mirror surface. Such a surface is often a very expensive part of the projection system due to special polishing of such a surface. Hence, the design of the projection system is often such that the dimensions of the optically active surfaces may be kept to a minimum. Interaction of the above described particles with the bottom of the projection system may have a detrimental effect on the intensity and/or accuracy of the patterned beam. A reduction in life-time of the optically active surfaces due to the interaction of the particles with these surfaces, or a removal of a layer of the optically active surface by re-polishing of the surface, may result in a substantial increase in at least the operational costs of the lithographic apparatus.

To reduce the likelihood of these particles reaching a sensitive part of the projection system, i.e. an optically active surface of the projection system, the lithographic apparatus includes a fluid provider that is arranged to provide a flow of purging gas along the optically active surface, across a space between the substrate and the optically active surface of the projection system, or across the substrate. The flow of purging gas protects the optically active surface of the projection system by diverting the particles away from their course towards an optically active surface of the projection system.

In this context it is also worth noting that the current tendency is aimed at more accurate projections that demand a higher numerical aperture number NA. This may be achieved by having the bottom of the projection system close to the substrate. Alternatively, or additionally, it is possible to provide a fluid having a relatively high refractive index, e.g. water, at a space between the bottom of the projection system and the substrate. Such an immersion liquid may also be applied to other spaces in the lithographic apparatus, for example, between the mask and the projection system. Immersion techniques are well known in the art for increasing the numerical aperture of optical systems and projection systems in particular. A lithographic apparatus may be provided with a fluid provider that is arranged to provide the immersion liquid, i.e. a liquid with a relatively high refractive index, or to keep the liquid in its place. The liquid may be flowing to avoid local heating. The fluid provider may thus provide a flow of purging gas, may provide a flow of liquid or may keep a liquid in its place, or may provide a combination of gas and liquid. The application of fluid provider between the substrate and the bottom of the projection system and the limitation of the distance between the bottom of the projection system and the substrate, results in very limited space available for the fluid provider. Consequently, fluid providers are designed so as to meet their functional requirements within a constraint space. Given the above mentioned circumstances it will be appreciated that their is very little space left for replacing the substrate.

SUMMARY

It is an aspect of the invention to provide a lithographic apparatus in which replacement of the substrate is possible, while still meeting the conditions with regard to the NA number and/or meeting good purging conditions.

According to an aspect of the invention, there is provided a lithographic projection apparatus. The apparatus includes a substrate support constructed to support a substrate, a projection system configured to project a patterned radiation beam onto a target portion of the substrate, and a frame onto which at least a part of the projection system is mounted. A fluid provider is arranged to provide a fluid between the substrate and a downstream end of the projection system. The apparatus also includes an actuator that is associated with the frame and with the fluid provider and arranged to position the fluid provider, and a cushion system for cushioning vibrational forces when the actuator positions the fluid provider.

According to a further aspect of the invention there is provided an actuator for use in lithographic apparatus. The actuator is arranged to be associated with a frame and with a device and is further arranged to position the device. The actuator is provided with at least one cushion system for cushioning vibrational forces when the actuator positions the device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
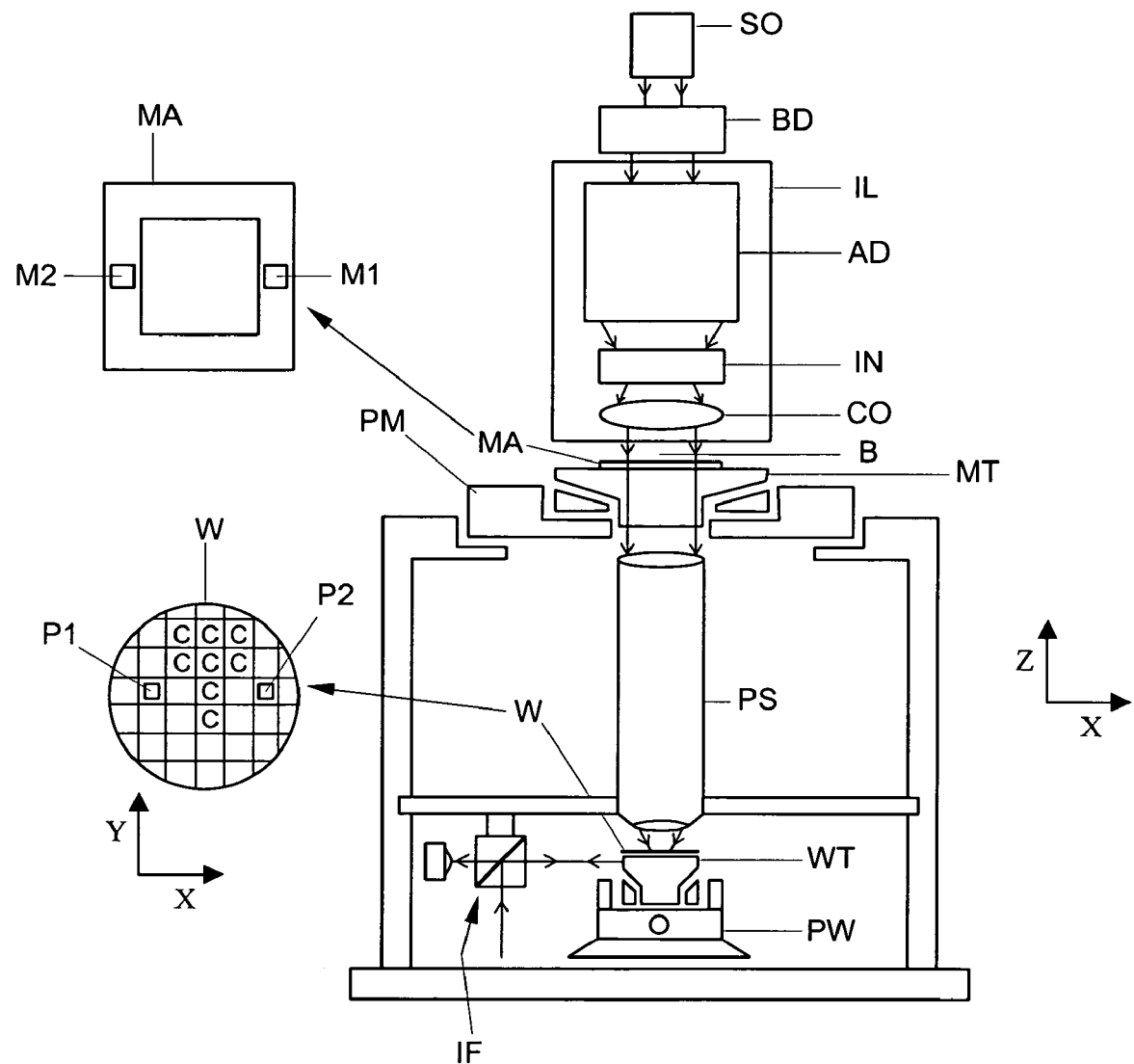
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation or EUV radiation) a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Such a frame is often referred to as the Metro Frame MF. It may be made of INVAR®, or of aluminum and kept within a few milli Kelvin at a predetermined temperature so as to ensure its stable position. Many devices within the lithographic apparatus are connected to the Metro Frame and provide a relatively accurate reference for positions within the apparatus. An example of such a device is the position sensor IF.

Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system, in particular the so-called last lens element, and the substrate during exposure. The liquid may be provided and/or kept at its place, by a fluid provider FP. Additionally or alternatively, the fluid provider FP is arranged to provide a flow of purging gas so as to protect a bottom of the projection system from contaminating particles.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

Figure 2:
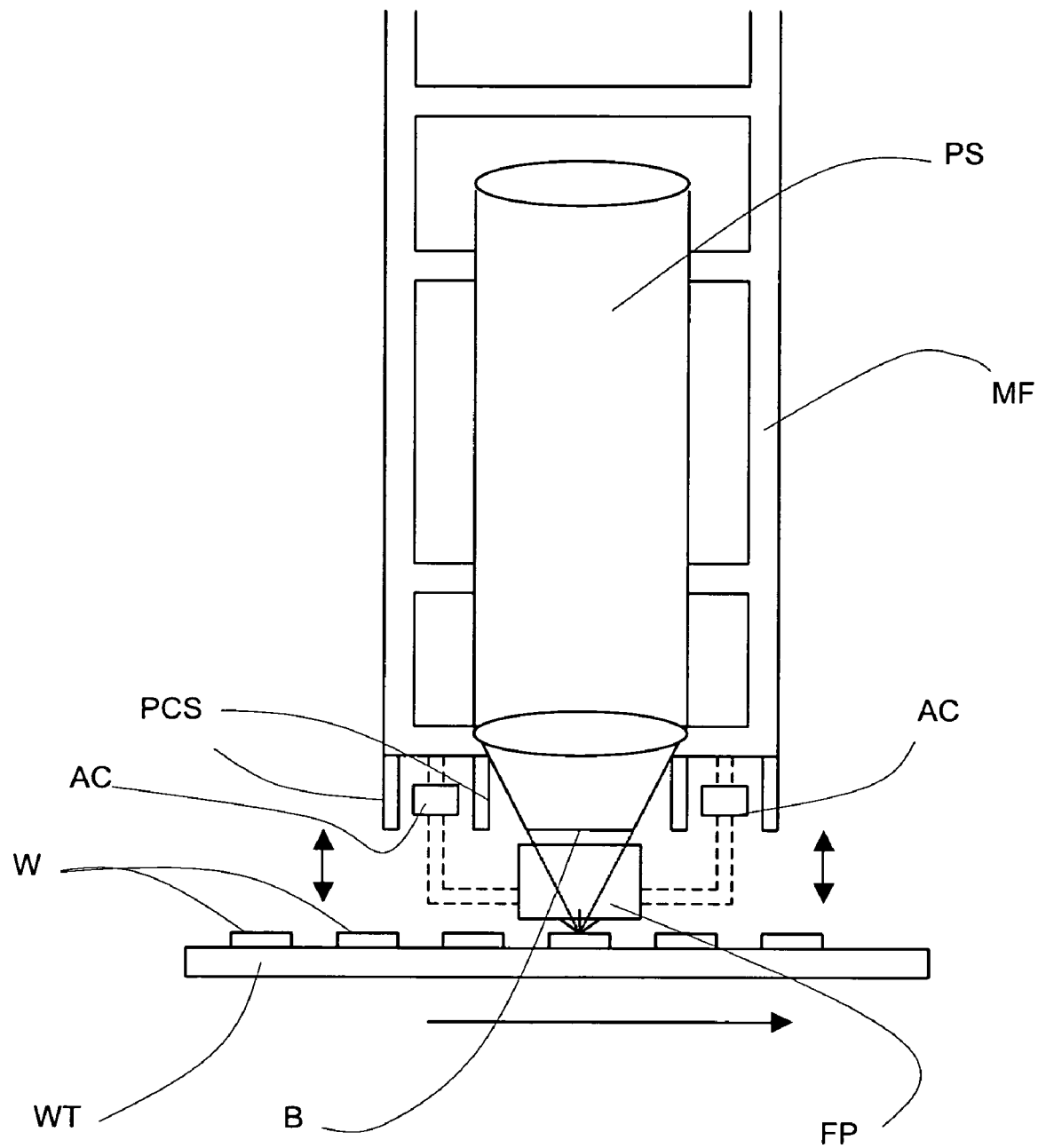
FIG. 2 depicts in more detail a part of a lithographic apparatus of FIG. 1 according to an embodiment of the invention.

FIG. 2 depicts in more detail a part of a lithographic apparatus according to an embodiment of the invention. The apparatus includes a substrate table WT constructed to hold at least one substrate W. The apparatus further includes a projection system PS configured to project a patterned radiation beam onto a target portion of the substrate W. The apparatus also includes a frame MF, hereinafter also referred to as Metro Frame, onto which at least a part of the projection system is mounted. The apparatus also includes a fluid provider FP that is arranged to provide a fluid between the substrate W and a downstream end B of the projection system PS. The apparatus further includes at least one actuator AC that is associated with the frame MF and with the fluid provider FP. The at least one actuator AC is arranged to at least partly position the fluid provider FP. The term at least partly positioning the fluid provider encompasses positioning the fluid provider with respect to the frame MF and/or the substrate W. This may entail only a course positioning that should be supplemented or followed by, for example, a fine positioning or an additional positioning carried out by, for example, another actuator or even an actuator solely associated with the substrate W.

Mounted on the frame MF on either side of the actuators AC are parts PCS that will further be elaborated on when discussing FIGS. 3 to 8. The vertical arrows AW in FIG. 2 indicate that the fluid provider FP is movable up and down and the substrate table WT is movable such that another substrate W is moved on a position onto which the projection beam focuses. The direction into which the fluid provider is movable is not necessarily a vertical direction. If the optical axis has a direction different from a vertical direction and/or the wafer is not positioned horizontally, the movability of the fluid provider may accordingly be different from the direction indicated in the figures. Connections for a fluid are, for the sake of clarity, not shown in FIG. 2. It will however be appreciated by the person skilled in the art that such connections will be connected to the fluid provider FP. Although only two actuators AC are shown, it is possible that the fluid provider FP is associated with any number of actuators between one and six, i.e. one actuator for each degree of freedom. Each actuator only partly positions the fluid provider FP. By associating the actuators with the Metro Frame MF, and on its turn, the fluid provider FP with the actuators AC, a good reference may be provided for positioning the fluid provider FP.

Figure 3:
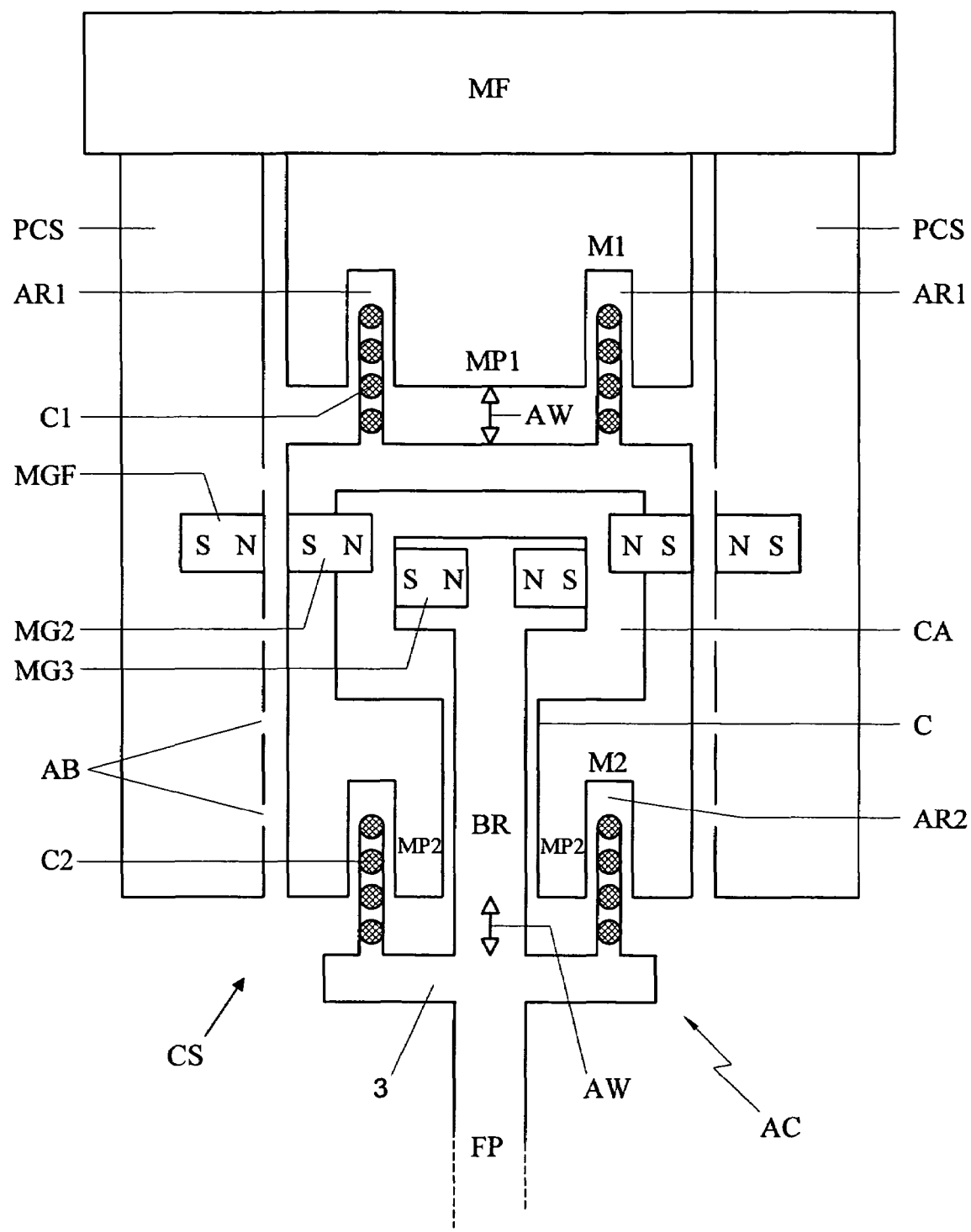
FIG. 3 depicts schematically an actuator according to an embodiment of the invention as a part of a lithographic apparatus.

FIG. 3 shows schematically in more detail a first embodiment of an actuator AC according to the invention for use in a lithographic apparatus. The apparatus according to the invention is provided with a cushion system for cushioning vibrational forces when the actuator AC positions the fluid provider FP. This fluid provider FP is schematically depicted at the bottom of FIG. 3 by a dotted line. The cushion system may also be suitable for cushioning vibrational forces which are generated in the fluid provider FP due to movement of the fluid provider FP initiated by at least one phenomenon unrelated to an activity of the actuator AC, such as a flow of the fluid. It should be noted that in the embodiment shown, the cushion system and the actuator AC are at least partly integrated with one another. In other words, some parts may perform a function that is entirely related to the positioning, and these parts are thus parts of the actuator. The coils may in this context be seen as parts of the actuator. Other parts may perform a function that is entirely related to the cushioning. These parts are parts of the cushioning system. Springs and masses may belong to this group of parts. Another group of parts perform functions that are related to both the actuating and the cushioning. In this situation, the cushion system and the actuator are at least partly integrated with one another. Magnetic material, having a mass and interacting with coils of the actuator, may be seen as parts belonging to both the actuator and the cushioning system. Some parts of the cushion system, for example, parts PCS, are not integrated with the actuator AC. Bearing in mind the function of parts, it should generally be clear which parts in FIG. 3 to FIG. 8 will belong to both the actuator AC and the cushion system CS, which parts will only belong to the cushion system CS and which parts will only belong to the actuator AC. It should also become clear that due to the cushion system, the actuator AC is able to position the fluid provider FP with high speed and high frequency without passing on major vibrational forces to the Metro Frame MF.

As the actuator AC and the cushion system are in one embodiment at least partly integrated, sometimes reference is made to actuator/cushion system AC/CS. The actuator/cushion system AC/CS is provided with a first mass M1, which is connected to the Metro Frame MF. The mass M1 includes a material MP1 suitable for use in an electromagnet. A part of the mass M1, i.e. the part MP1, is surrounded by an annular recess AR1. A coil C1 is partly inserted in the annular recess AR1. By inducing an electric current through the coil C1, the coil C1, depending on the direction of the electric current, is, in this example, movable either up or down in a vertical direction of the drawing (indicated by the arrows AW), thereby acting as an electromagnet in a way that is known in the art. The coil C1 is connected to a mass M2. At least a part of M2, indicated by MP2, also includes material suitable for use in an electromagnet. Also, these parts MP2 in mass M2 are surrounded by an annular recess AR2 into which a coil C2 is inserted. Coil C2 is further connected to the fluid provider FP via a bar BR. The fluid provider FP itself is only schematically shown in FIGS. 3 and omitted in FIGS. 4–8. By inducing an electric current through coil C2 the coil, depending on the direction of the electric current, movable either up or down in the annular recess AR2 like an electro magnet. The cushion system includes at least one mass M2 movable with respect to the frame MF and with respect to the fluid provider FP. Hence, vibrational forces passed on from the fluid provider FP to mass M2, intrinsically inert, are not necessarily passed on from inert mass M2 to frame MF. Mass M2 will in use cushion or dampen these vibrational forces. For the sake of clarity, electrical wires running to coil C1 and C2 are not shown.

In the embodiment shown in FIG. 3, the mass M2 is associated with the Metro Frame MF by magnetic forces, and these magnetic forces may be generated as follows. Solidly connected to the Metro Frame MF are parts PCS, which hold magnets MGF at a predetermined position. Also, mass M2 is provided with magnets MG2 at a predetermined position. Note that the polarities of magnets MGF and MG2, indicated with N and S, are such that the magnets attract each other. A position at which the mass M2 will be held when the actuator holds the fluid provider FP, at least relative to the substrate, corresponds to a position at which each magnet MGF is close to one of the magnets MG2. As shown, all of these magnets may be permanent magnets. It is, however, possible to use electro magnets.

In the embodiment shown in FIG. 3, mass M2 is also associated with the fluid provider FP by magnetic forces. The fluid provider FP is provided with a bar BR that extends through a channel C provided in mass M2. The bar BR is at an end directed towards mass M2 and is provided with at least one magnet MG3. Mass M2 may also be provided with a magnet that may interact with the magnet MG3 provided at the end of the bar BR. In the embodiment shown in FIG. 3, the end of the bar is provided with two separate magnets. Each of these magnets MG3 interact with a magnet MG2 provided in the mass M2. The magnets MG2 may also interact with the magnets MGF in the parts PCS. However, mass M2 may also have different sets of magnets for interaction with magnets provided in PCS, and with magnets provided in bar BR. The polarity of the magnets is such that the fluid provider FP is held at a predetermined distance from the substrate when no current is running through coil C2. This may equally apply to positioning of mass M2 with respect to the parts PCS when no current is running through C1. In other words, when no power is supplied to the coils C1 and C2, the actuator AC is arranged so that the fluid provider FP does not come into contact with substrate W or the substrate table WT. During an unforeseen power-cut, the fluid provider FP is moved or held at a position at which it cannot come into contact with substrate W or substrate table WT. This means that the electric current running through C2 should be such that, in operation, i.e., when the actuator intends to at least partly position fluid provider FP close to the substrate W, the fluid provider FP should be forced to move away from a position at which it was held by the magnets MG2 and MG3 and MGF.

The use of magnetic forces, as occurs in the embodiment shown in FIG. 3, may have the advantage that no mechanical contact occurs between the different parts. Hence, vibrational forces should not be transmitted mechanically. The use of an electromagnet for actuating may allow for relatively easy operation.

The actuation/cushion system, as shown in FIG. 3, works as follows. When a substrate is placed onto the substrate table, the fluid provider FP is moved upwards in order to create some space. After replacement of the wafer, the fluid provider FP may move towards the substrate. When the fluid provider FP is supposed to move towards the substrate, a current in coil C2 will be running such that part 3, i.e. the fluid provider FP, will move towards the substrate in a direction of the arrows AW shown on bar BR. The electromagnetic force generated will have to partly overcome the magnetic forces between the magnets MG2 belonging to M2 and the magnets MG3 belonging to part 3. When the fluid provider FP is supposed to move away from the substrate, part 3 will move upwards in the direction of the arrow shown on bar BR. This may be done either by stopping the current running in coil C2, which may lead to uncontrolled acceleration of bar BR, or by slowly decreasing the current running in coil C2, thereby leading to very controlled movement back upwards. The latter should introduce much less vibrational forces into the actuator and/or cushion system. However, high frequency and high speed may be required, which may still introduce vibrational forces when the fluid provider FP is actuated in the direction away from the substrate W/substrate table WT, or in a direction towards the substrate W/substrate table WT. When vibrational forces are generated, high frequency vibrations should not be transmitted to the Metro Frame MF, as the cushioning system, including mass M2 as associated with the fluid provider FP and mass M1 and/or Metro Frame MF, should "absorb" these vibrations. Low frequency vibrations may be transmitted to the Metro Frame; however, these have turned out not to be a real problem.

In an embodiment shown in FIG. 3, it is possible to position the magnets MG2 and MGF such that the average current, taking into account both directions of the electric current, is kept as low as possible in absolute values, in order to generate as little heat as possible, thereby avoiding local heating of the Metro Frame MF at positions where the mass M1 is connected to the Metro Frame MF.

It is possible to provide air bearings in parts PCS as indicated by apertures AB, which guide the mass M2 when it moves and reduces friction. The air bearings may also form part of the cushion system.

The air bearing may thus be applied such that some further damper is provided.

Note that bar BR to which fluid provider FP is attached at a lower end thereof is limited in the extent to which it can move away form part M2. Bar BR extends into a cavity CA of mass M2 and has at its end extending in the cavity a shape such that it cannot pass through channel C. This may provide for further safety in case magnets MG3 and MG2 are not permanent magnets, but are electromagnetic magnets, which may be prone to failure when a power-cut occurs.

As indicated before, the cushion system shown in the embodiment of FIG. 3 is also capable of isolating vibrational forces with respect to the Metro Frame MF when the actuator does not position the fluid provider FP, but when vibrational forces are generated anyway due to a movement of the fluid provider initiated by at least one phenomenon unrelated to an activity of the actuator AC, such as a flow of the fluid.

Figure 4:
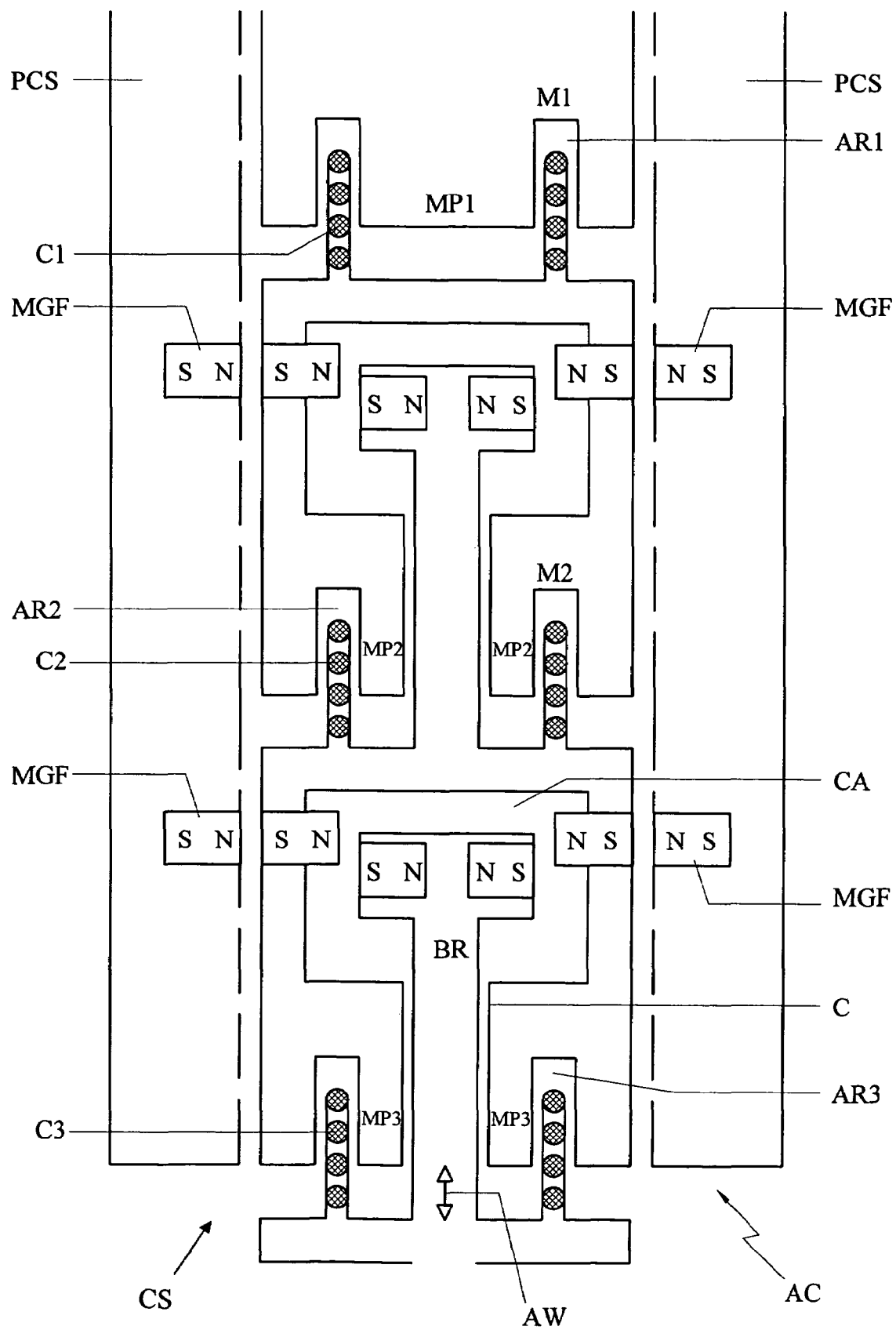
FIG. 4 depicts schematically an actuator according to an embodiment of the invention as a part of a lithographic apparatus.

FIG. 4 shows an embodiment that is similar to FIG. 3 apart from the fact that it has two masses, mass M2 and mass M3, which are both movable with respect to the frame MF and with respect to the fluid provided FP. These masses M2 and M3 are also movable with respect to each other. This cushion system should be able to absorb the vibrational forces even more efficiently, due to the fact that each mass should be able to absorb some of the vibrational frequencies. This may improve positioning of the fluid provider without compromising on the stability of the Metro Frame, further leading to a good and reproducible quality of the dimensions of features produced in the substrate W and thus to a good overlay.

Figure 5:
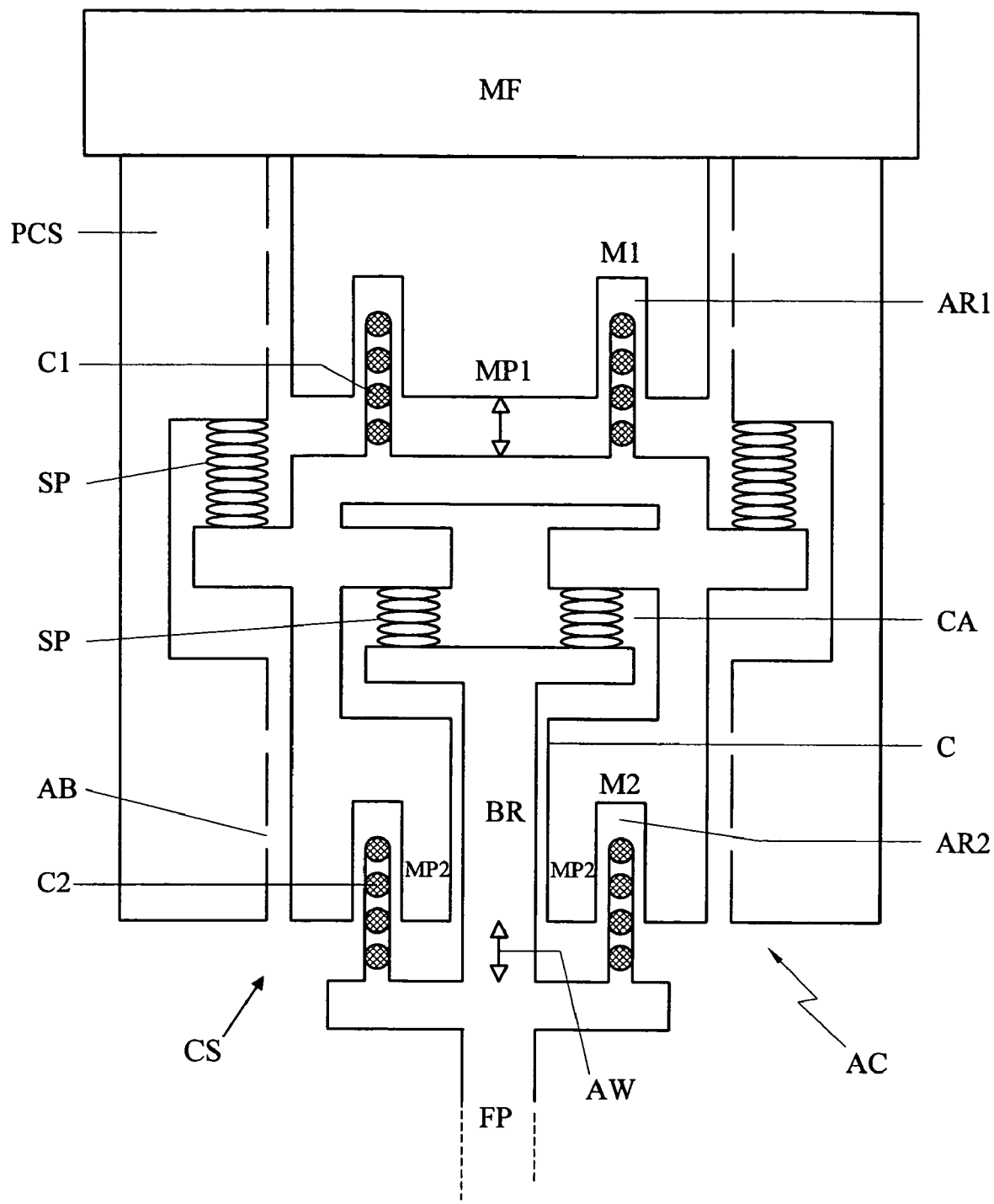
FIG. 5 depicts schematically an actuator according to an embodiment of the invention as a part of a lithographic apparatus.

FIG. 5 shows an embodiment in which the magnets MGF, MG2 and MG3 in the embodiment of FIG. 3 are replaced by resilient elements, such as springs SP. Although these springs SP allow for some "cross-talk" between the different parts of the cushion system/actuator, an advantage of the use of springs is that all parts are connected and that, hence, a sudden removal of magnetic forces due to, for example, a power-cut should not lead to dropping of any parts downwards.

Figure 6:
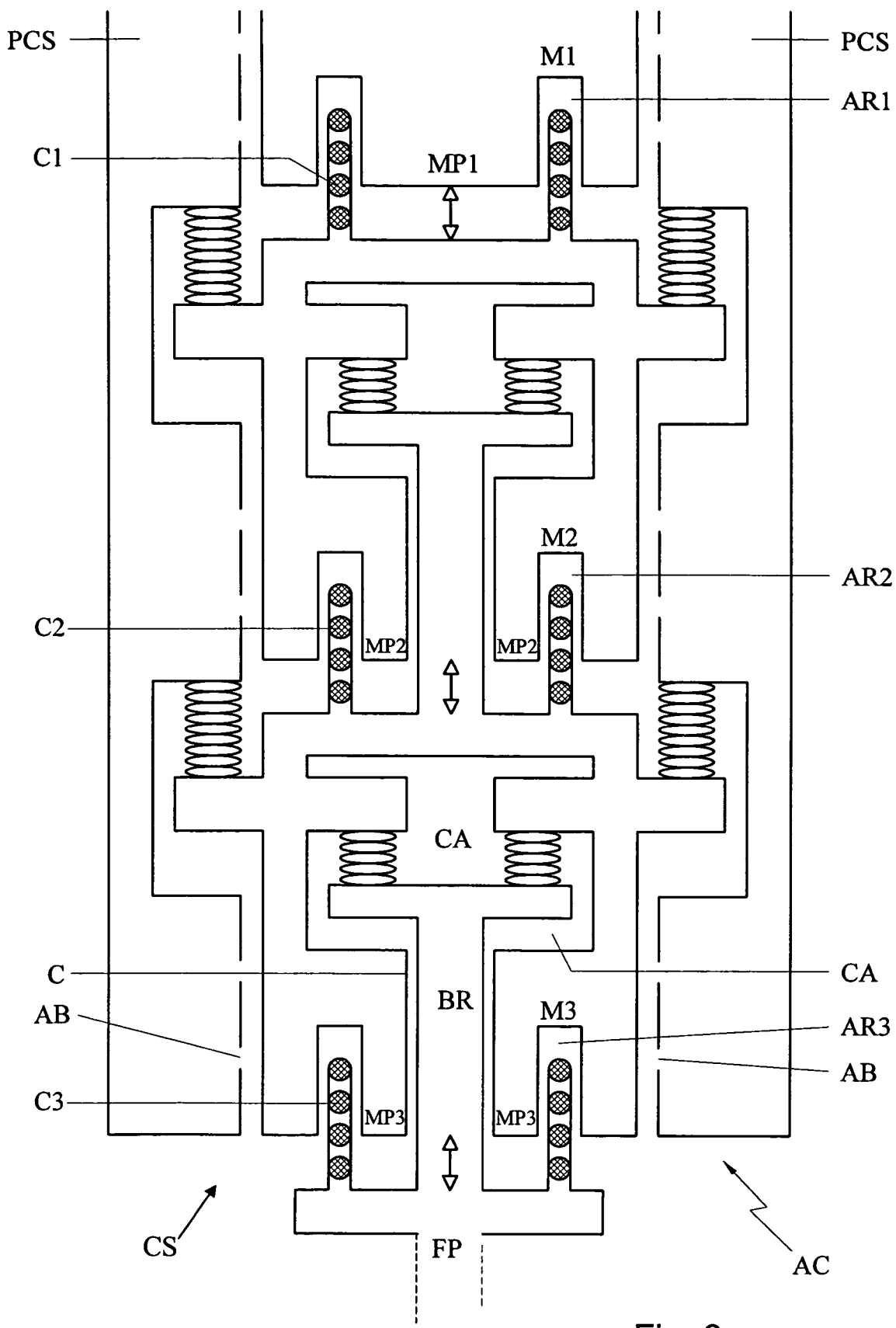
FIG. 6 depicts schematically an actuator according to an embodiment of the invention as a part of a lithographic apparatus.

FIG. 6 is comparable with the embodiment shown in FIG. 4, apart from the fact that all magnets MGF, MG2, MG3 are replaced by springs. The comments put forward when discussing FIG. 5 equally apply to FIG. 6.

Figure 7:
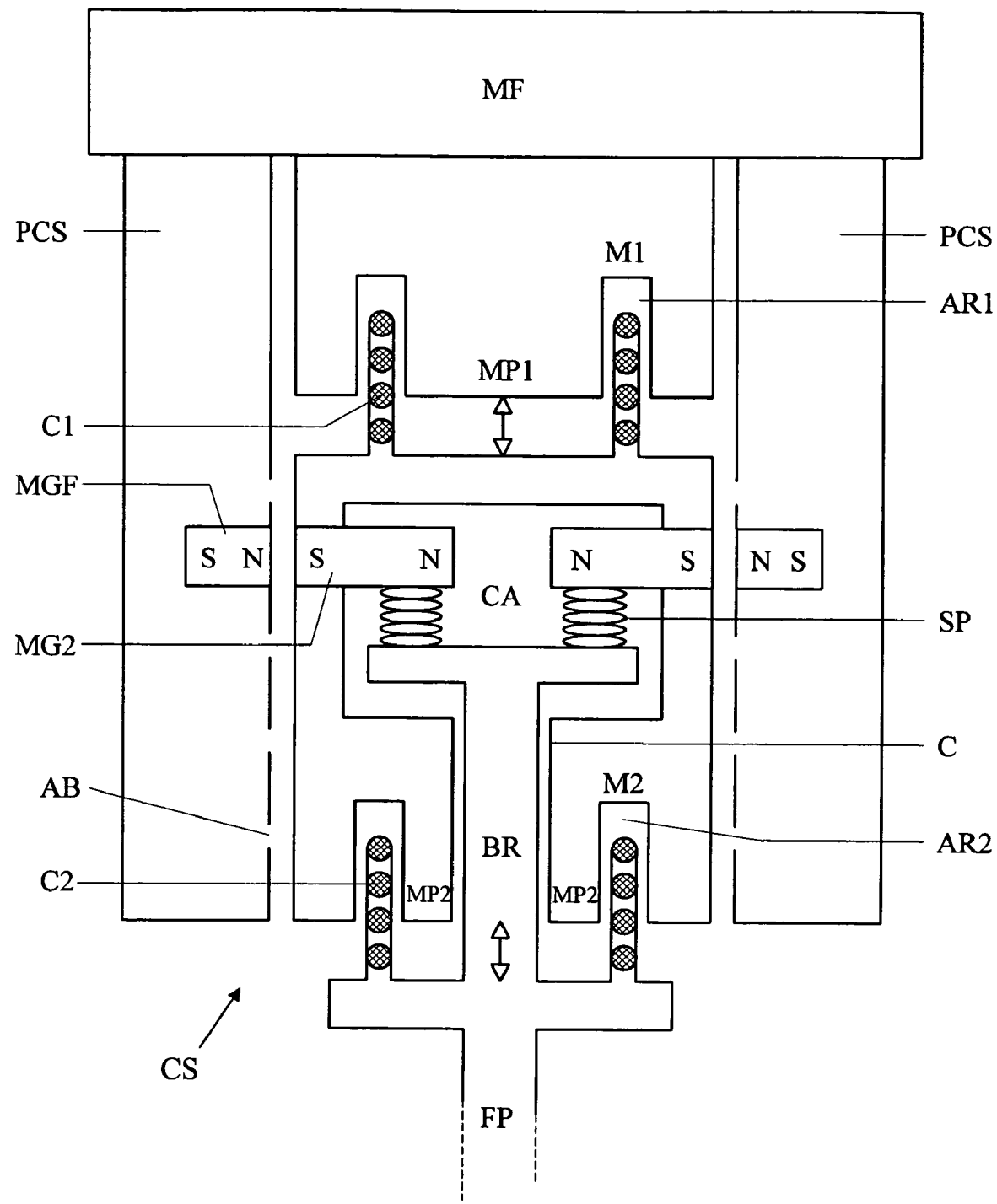
FIG. 7 depicts schematically an actuator according to an embodiment of the invention as a part of a lithographic apparatus.
Figure 8:
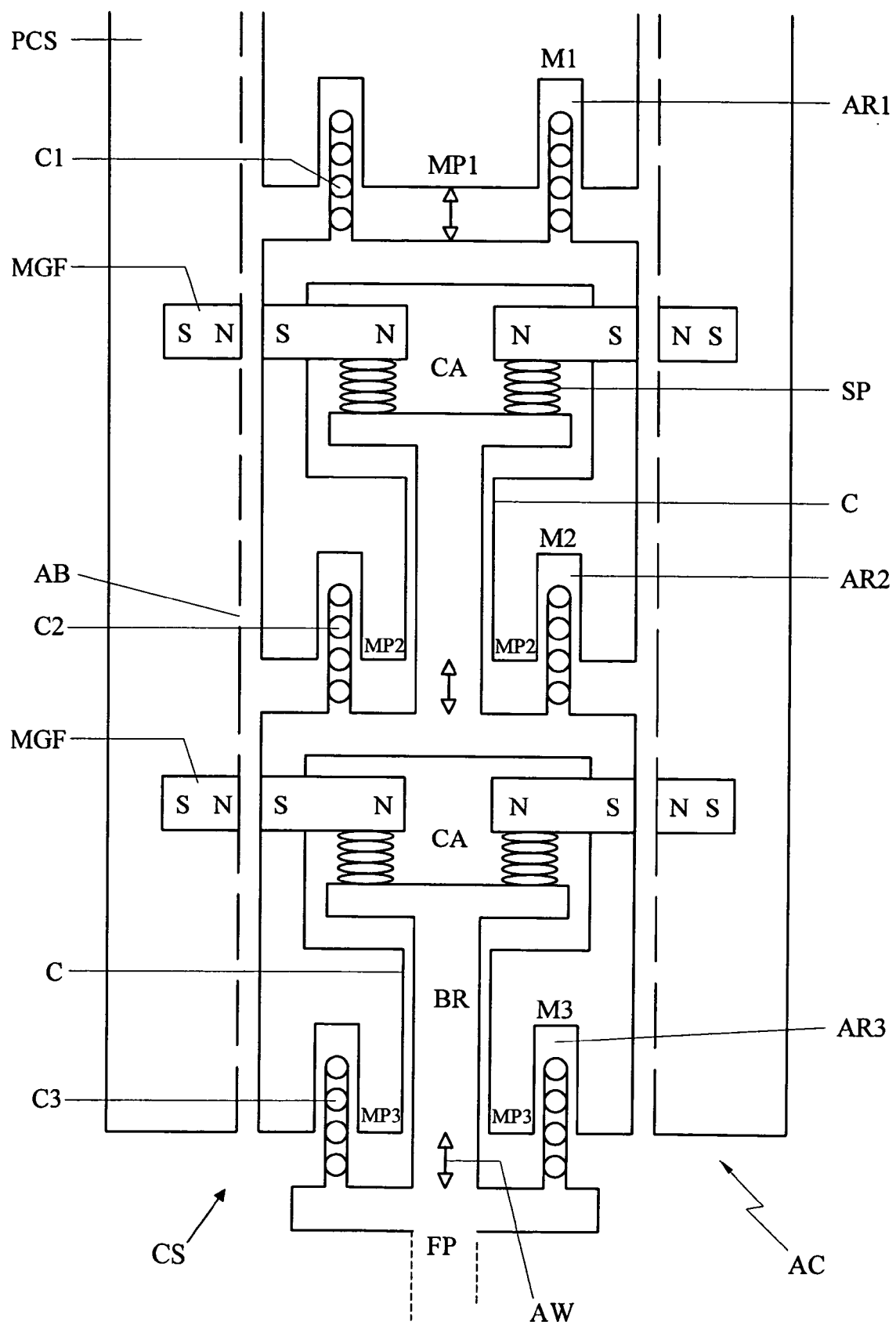
FIG. 8 depicts schematically an actuator according to an embodiment of the invention as a part of a lithographic apparatus.

FIG. 7 and 8 show that not all magnets MGF, MG2 and MG3 in an embodiment are necessarily replaced by springs SP. It is also possible to replace, for example, only magnets MG3 by springs SP.

The explanation given with respect to FIG. 3 generally applies to FIGS. 4–8.

A person skilled in the art will be able to establish which strengths of magnet, dimensions of masses etc., will lead to optimal results by routine experiments.

It should be borne in mind that although actuating has in the description above been referred to as initiated by for example an electromagnetic force, it is within the scope of the invention additionally, or alternatively, possible that actuating occurs by applying a fluid force.

United States Published Patent Application No. 2003/0197914 A1 describes an actuator arranged to position an optical element and to reduce unwanted vibrations in the optical element. Such optical elements are generally not exposed to forces unrelated to forces initiated by the actuator. Furthermore, an actuator arranged to position an optical element is an actuator which is arranged to keep the optical element at its position. In contrast, an actuator according to the invention is an actuator that is arranged to move the fluid provider to and from a position which is related to movements of the substrate table. Hence, the actuator itself and its application in a lithographic apparatus, as described in US 2003/0197914 A1, are different from the actuator and the lithographic apparatus described according to the invention.

Although it is possible to design the actuator/cushion system, such that a cylindrical symmetry is achieved with respect to a direction indicated by arrows AW, it is also possible that another geometry is applied by those skilled in the art.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic projection apparatus comprising:
   a substrate support constructed to support a substrate;
   a projection system configured to project a patterned radiation beam onto a target portion of the substrate;
   a frame onto which at least a part of the projection system is mounted;
   a fluid provider arranged to provide a fluid between the substrate and a downstream end of the projection system;
   an actuator associated with the frame and with the fluid provider and arranged to position the fluid provider; and
   a cushion system for cushioning vibrational forces when the actuator positions the fluid provider,
   wherein the cushioning system and the actuator are at least partly integrated with one another such that at least one part of the actuator is constructed and arranged to perform a function that is related to both actuating and cushioning.

2. A lithographic apparatus according to claim 1, wherein the cushion system substantially isolates the vibrational forces from the frame.

3. A lithographic apparatus according to claim 1, wherein the cushion system substantially isolates other vibrational forces that are generated in the fluid provider due to movement of the fluid provider initiated by a phenomenon unrelated to an activity of the actuator from the frame.

4. A lithographic apparatus according to claim 3, wherein the phenomenon includes flow of the fluid.

5. A lithographic apparatus according to claim 1, wherein the fluid is a purging gas.

6. A lithographic apparatus according to claim 1, wherein the fluid is a liquid.

7. A lithographic apparatus according to claim 1, wherein the cushion system comprises a mass movable with respect to the frame and with respect to the fluid provider.

8. A lithographic apparatus according to claim 7, wherein the mass is associated with the fluid, provider and/or the frame by magnetic forces.

9. A lithographic apparatus according to claim 8, wherein the magnetic forces are generated using at least one permanent magnet.

10. A lithographic apparatus according to claim 8, wherein the magnetic forces are generated using at least one electromagnet.

11. A lithographic apparatus according to claim 10, wherein the actuator is arranged to actuate by increasing or decreasing an electromagnetic force.

12. A lithographic apparatus according to claim 11, wherein the apparatus is provided with a permanent magnet and/or a resilient element that is situated such that the fluid provider is moved away from the substrate when a power-cut occurs to the actuator.

13. A lithographic apparatus according to claim 7, wherein the mass is engaged with the fluid provider and/or the frame by a resilient element.

14. A lithographic apparatus according to claim 7, wherein the cushion system is provided with air bearings for guiding movement of the mass.

15. An actuator for use in a lithographic apparatus, wherein the actuator is arranged to be associated with a frame and with a device and is further arranged to position the device, and wherein the actuator is provided with at least one cushion system for cushioning vibrational forces when the actuator positions the device, and wherein the cushion system is arranged to isolate other vibrational forces that are generated in the device due to movement of the device initiated by at least one phenomenon unrelated to an activity of the actuator from the frame,
   wherein at least one part of the actuator is constructed and arranged to perform a function that is related to both actuating and cushioning.

16. An actuator according to claim 15, wherein the cushion system substantially isolates the vibrational forces from the frame.

17. An actuator according to claim 15, wherein the device is a fluid provider and the phenomenon includes flow of a fluid within the fluid provider.

18. An actuator according to claim 17, wherein the fluid is a purging gas.

19. An actuator according to claim 17, wherein the fluid is a liquid.

20. An actuator according to claim 15, wherein the cushion system comprises a mass that is movable with respect to the frame and with respect to the device, when the actuator is associated with the frame and with the device.

21. An actuator according to claim 20, wherein the mass is arranged to be associated with the device and/or the frame by magnetic forces.

22. An actuator according to claim 21, wherein the magnetic forces are generated using at least one permanent magnet.

23. An actuator according to claim 21, wherein the magnetic forces are generated using at least one electromagnet.

24. An actuator according to claim 20, wherein the mass is arranged to be associated with the device and/or the frame by a resilient element.

25. An actuator according to claim 15, wherein the actuator is arranged to actuate by increasing or decreasing an electromagnetic force.

26. An actuator according to claim 25, wherein the actuator is provided with at least one permanent magnet and/or a resilient element that is situated such that the device is moved away in a predetermined direction when a power-cut occurs to the actuator.

27. An actuator according to claim 15, wherein the cushion system is provided with air bearings for guiding movement of the mass.

28. An actuator for use in a lithographic apparatus, wherein the actuator is arranged to be associated with a frame and with a fluid provider and is further arranged to position the fluid provider, and wherein the actuator is provided with at least one cushion system for cushioning vibrational forces when the actuator positions the fluid provider, wherein at least one part of the actuator is constructed and arranged to perform a function that is related to both actuating and cushioning.

29. An actuator according to claim 28, wherein the fluid is a purging gas.

30. An actuator according to claim 28, wherein the fluid is a liquid.

* * * * *